United States Patent
Brechignac et al.

(10) Patent No.: US 6,174,113 B1
(45) Date of Patent: Jan. 16, 2001

(54) METHOD AND APPARATUS FOR MACHINING A CAVITY IN A SMART CARD

(75) Inventors: Rémi Brechignac, Grenoble; Jean-Manuel Bernardo, La Flachere, both of (FR)

(73) Assignee: STMicroelectronics S.A., Gentilly (FR)

(*) Notice: Under 35 U.S.C. 154(b), the term of this patent shall be extended for 0 days.

(21) Appl. No.: 09/246,018

(22) Filed: Feb. 5, 1999

(30) Foreign Application Priority Data

Feb. 6, 1998 (FR) .................................................. 98 01423

(51) Int. Cl.⁷ ....................................................... B23C 3/00
(52) U.S. Cl. ........................... 409/132; 29/825; 409/186; 409/193
(58) Field of Search ..................................... 409/131, 132, 409/186, 193, 195; 29/825, 827; 156/64; 324/226, 207.26

(56) References Cited

U.S. PATENT DOCUMENTS

| | | | |
|---|---|---|---|
| 3,720,135 | * | 3/1973 | Merner et al. ......................... 409/188 |
| 3,741,071 | * | 6/1973 | Hoglund ................................ 409/195 |
| 3,918,348 | * | 11/1975 | Runft .................................... 409/195 |
| 4,657,451 | * | 4/1987 | Tanaka ................................. 409/186 |
| 4,722,645 | * | 2/1988 | Regan .................................. 408/439 |
| 4,812,633 | * | 3/1989 | Vogelgesang et al. .............. 235/487 |
| 4,821,460 | * | 4/1989 | Wegmann ............................ 409/186 |
| 5,094,574 | * | 3/1992 | Nishigai et al. ..................... 409/132 |
| 5,159,182 | * | 10/1992 | Eisele ................................... 235/492 |
| 5,255,430 | * | 10/1993 | Tallaksen ............................. 29/827 |
| 5,809,633 | * | 9/1998 | Mundigl et al. ...................... 29/827 |
| 5,879,113 | * | 3/1999 | Ueyama et al. ..................... 409/148 |
| 5,906,460 | * | 5/1999 | Link et al. ............................ 409/186 |
| 5,988,512 | * | 11/1999 | Eisele .................................. 235/487 |
| 6,015,249 | * | 1/2000 | Sacchetti ............................. 409/186 |

FOREIGN PATENT DOCUMENTS

| | | |
|---|---|---|
| 3206354 | 9/1983 | (DE) . |
| 4340249 | 6/1995 | (DE) . |
| 0013187 * | 2/1977 | (JP) ................................... 409/186 |
| 0306113 * | 11/1989 | (JP) ................................... 409/132 |
| 05004105 | 1/1993 | (JP) . |
| 05337895 | 12/1993 | (JP) . |

OTHER PUBLICATIONS

French Search Report dated Oct. 12, 1998 with annex on French Application No. 98–01423.

* cited by examiner

*Primary Examiner*—Daniel W. Howell
(74) *Attorney, Agent, or Firm*—Theodore E. Galanthay; Stephen C. Bongini; Fleit, Kain, Gibbons, Gutman & Bongini P.L.

(57) ABSTRACT

A machining method is provided for use with a smart card of the type having at least one conducting winding at some distance from the opposed faces of the card, with the end portions of the winding forming electrical connection pads for an electronic chip. According to the method, an electric potential is generated in the winding. The milling tool is made to orthogonally penetrate the card in a region of at least one of the pads, and the electric potential of the milling tool is concomitantly monitored to detect a variation in electric potential that identifies a reference position of the milling tool with respect to the card and pad. The penetration of the milling tool is continued for a predetermined travel from the reference position so as to reach a machining position. In one preferred method, the milling tool is moved parallel to the card at the depth of the machining position in order to form a cavity in the smart card. A machining apparatus for machining a cavity in a smart card is also provided.

16 Claims, 2 Drawing Sheets

METHOD AND APPARATUS FOR MACHINING A CAVITY IN A SMART CARD

CROSS-REFERENCE TO RELATED APPLICATIONS

This application is based upon and claims priority from prior French Patent Application No. 98-01423, filed Feb. 6, 1998, the entire disclosure of which is herein incorporated by reference.

BACKGROUND OF THE INVENTION

1. Field of the Invention

The present invention relates to smart cards, and more specifically to the manufacturing of a smart card with an antenna.

2. Description of Related Art

In conventional methods of manufacturing a smart card with an antenna, a smart card containing at least one metal winding is first manufactured. The metal winding is located some distance from the opposed faces of the card and the ends of the winding form electrical connection pads. A cavity is milled in the card to expose the connection pads, and then an electronic chip is fixed in the cavity and connected to the exposed pads. In order to mill the cavity, the milling tool is made to penetrate the card step-by-step and is withdrawn between steps in order to allow a visual inspection to determine if the connection pads have been exposed. By repeating this process, the desired cavities are formed in a series of smart cards.

Because the smart cards do not always have the same thickness, the typical antenna has a thickness of 35 or 70 microns, and the antenna is not always placed at the same distance from the faces of the card, the machining of cavities in a series of cards produces a high percentage of cards in which the pads of the antenna are not exposed or are completely machined (i.e., destroyed). Obviously, such incorrectly machined cards must be rejected. To limit the number of cards that are rejected, the operator must closely monitor the machining process to insure that the cavity is being correctly produced in each card, and must frequently carry out the repeated machining and inspection operations described above. The required machining time and high rejection rate cause conventional methods of manufacturing smart cards to have low productivity and high manufacturing costs.

SUMMARY OF THE INVENTION

In view of these drawbacks, it is an object of the present invention to remove the above-mentioned drawbacks and to provide an apparatus and method for machining smart cards that significantly reduce the rejection rate due to incorrect machining.

One embodiment of the machining method of the present invention is provided for use with a smart card of the type having at least one conducting winding at some distance from the opposed faces of the card, with the end portions of the winding forming electrical connection pads for an electronic chip. According to the method, an electric potential is generated in the winding. The milling tool is made to orthogonally penetrate the card in a region of at least one of the pads, and the electric potential of the milling tool is concomitantly monitored to detect a variation in electric potential that identifies a reference position of the milling tool with respect to the card and pad. The penetration of the milling tool is continued for a predetermined travel from the reference position so as to reach a machining position. In one preferred method, the milling tool is moved parallel to the card at the depth of the machining position in order to form a cavity in the smart card. In some methods, the electric potential is generated in the winding through the generation of an electromagnetic field in the environment of the card. In other methods, a point is inserted into the card to a level at which contact is made with the winding, and an electric potential source connected to the point generates the electric potential in the winding.

According to another embodiment of the present invention, a machining apparatus is provided for machining a cavity in a smart card. The machining apparatus includes a table for holding a card, a drive mechanism, and a milling tool. The drive mechanism rotates and feeds the milling tool, and a control circuit controls the drive mechanism. Additionally, an electromagnetic field generator is placed in the vicinity of the card. A detector detects a variation in the electric potential of the milling toot and delivers a reference signal to the control circuit when the variation exceeds a predetermined value. In an alternative embodiment of the machining apparatus, the electromagnetic field generator is omitted and a point is provided for insertion into the card to a level at which contact is made with the winding. The point is connected to an electric potential source.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
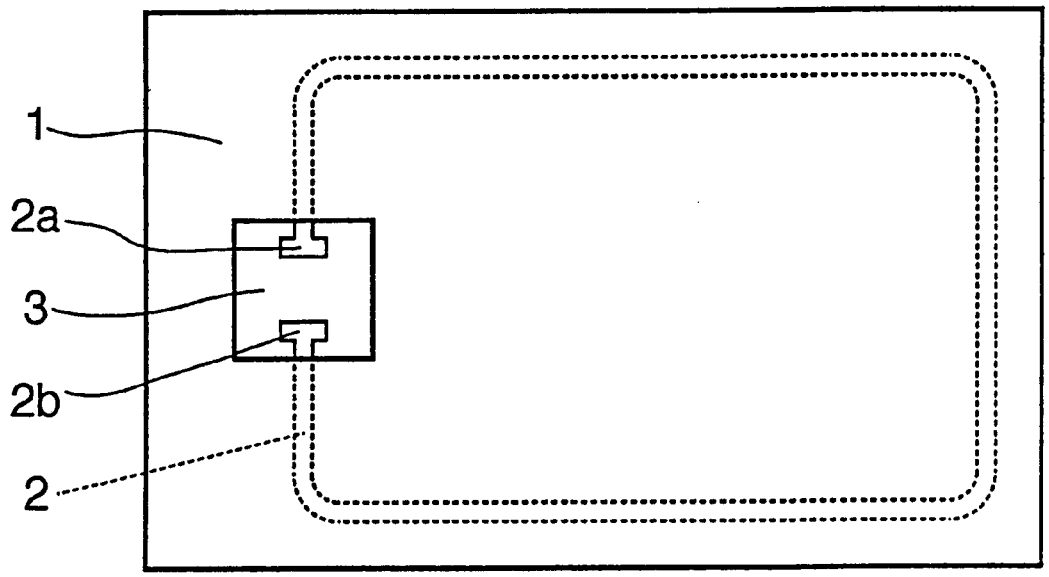
FIG. 1 is a drawing showing a top view of a smart card that has a machined cavity.
Figure 2:
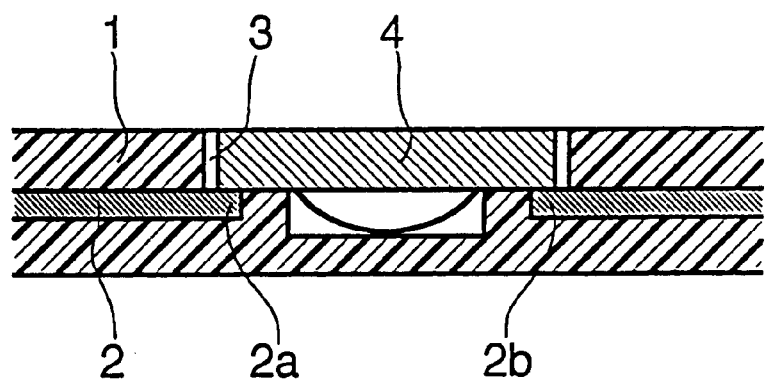
FIG. 2 is a cross-sectional view showing a smart card that has an electronic chip in a machined cavity.

FIGS. 1 and 2 show an exemplary smart card having a thickness of approximately 1 millimeter, a width of approximately 50 millimeters, and a length of approximately 80 millimeters. The smart card 1 contains a conducting (e.g., metal) winding 2 that extends a short distance from the sides of the card and at approximately the same distance from the opposed faces of the card. The two end pads 2a and 2b of the winding are located a short distance from each other in the central region of one of the widths of the card.

Such a smart card can be formed by depositing metal on a first plastic sheet so as to form the winding 2, and then adhesively bonding a second plastic sheet to the face of the first plastic sheet that holds the winding. Next, a flat-bottomed cavity 3 is made in the card 1 to expose the end pads 2a and 2b of the winding 2, and an electronic chip 4 is adhesively bonded in the cavity 3 so as to be substantially flush with the adjacent external face of the card 1. Further, the end pads 2a and 2b of the winding 2 are made to electrically contact the corresponding connection pads on the electronic chip 4. Thus, the winding 2 forms an antenna that is connected to an integrated circuit in the electronic chip 4.

Figure 3:
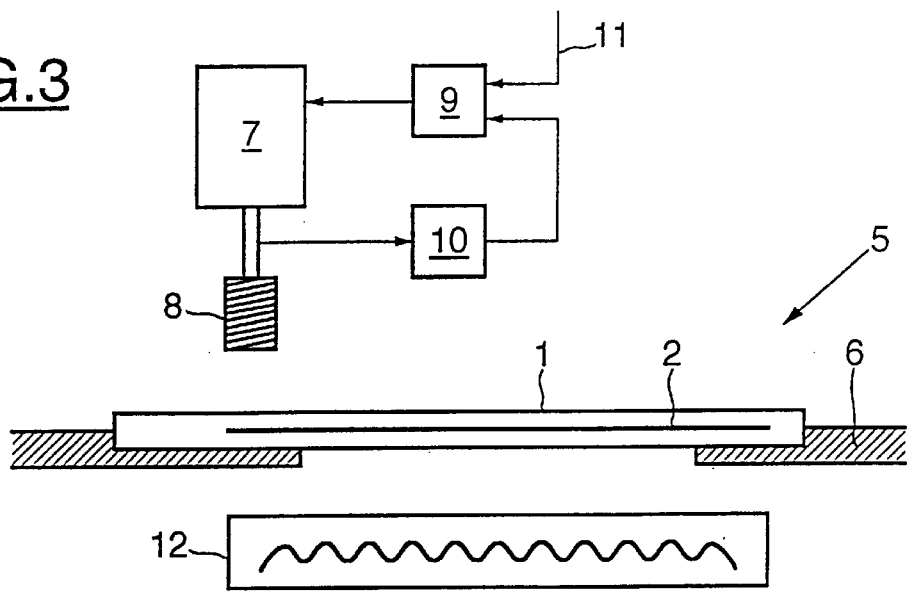
FIG. 3 is a block diagram showing a machining apparatus according to one embodiment of the present invention.
Figure 4:
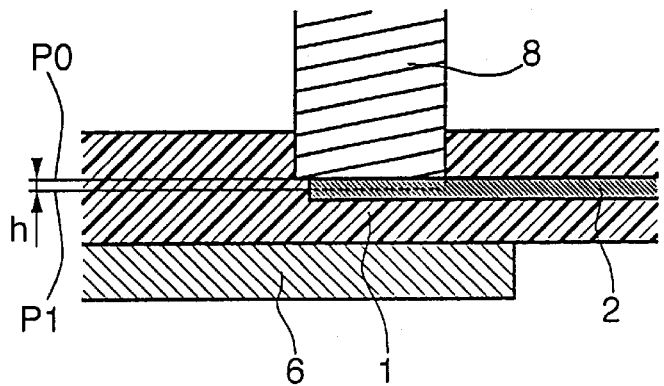
FIG. 4 is a cross-sectional view showing a smart card during machining.

A machining apparatus for milling the chip-holding cavity in the smart card will now be described with reference to FIGS. 3 and 4. The apparatus 5 includes a table 6, a drive mechanism 7, and a milling tool 8. The table holds the smart card 1 while the drive mechanism 7 rotates and feeds the milling tool 8. A control circuit 9 uses an automatic machining program to automatically control the drive mechanism 7. Additionally, an electronic detector 10 detects an electric potential of the milling tool 8 and delivers a reference signal to the control circuit 9 when the electric potential of the milling tool 8 varies beyond a predetermined threshold.

Preferably, another input of the control circuit 9 receives a predetermined value that corresponds to a predetermined feed travel h of the milling tool 8 orthogonal to the card 1. An electromagnetic wave generator 12 is placed below and at a short distance from the card 1 in order to generate an electromagnetic field in the environment of the card 1. Because of the electromagnetic field, an electric potential is generated in the winding 2 of the card 1. The operation of the machining apparatus of FIGS. 3 and 4 will now be explained.

Under the control of the program of the control circuit 9, the drive mechanism 7 positions the milling tool 8 in the region of one of the pads 2a or 2b of the winding 2 in the smart card 1. The milling tool 8 is made to rotate, and then the drive mechanism 7 makes the milling tool 8 orthogonally penetrate the card 1 at a predetermined feed rate. When the milling tool 8 comes into contact with the pad 2a or 2b of the winding 2, there is an electrical connection so the electric potential of the milling tool 8 starts to vary in correspondence to the electric potential of the winding 2. The detector 10 detects the variation in the electric potential of the milling tool 8 and sends a reference signal to the control circuit 9 to indicate that the milling tool 8 has just reached a depth reference position P0.

When the reference signal is received, the control circuit 9 orders the feed mechanism to continue penetrating the milling tool 8 into the card 1 for the predetermined travel h that is programmed through the other input of the control circuit. When the additional travel has been accomplished, the control circuit 9 stops the penetrative feed of the milling tool 8 and completes the milling of the cavity 3 in the smart card 1 by moving the milling tool 8 in a direction parallel to the card 1 at the machining position or depth P1 that was set with respect to the reference position P0 of the milling tool as detected by the detector 10. In one preferred embodiment, the additional penetrative travel h of the milling tool 8 is equal to approximately 25% of the thickness of the winding 2 (i.e., approximately 25% of the thickness of the winding 2 is removed for the bottom of the cavity 3).

Figure 5:
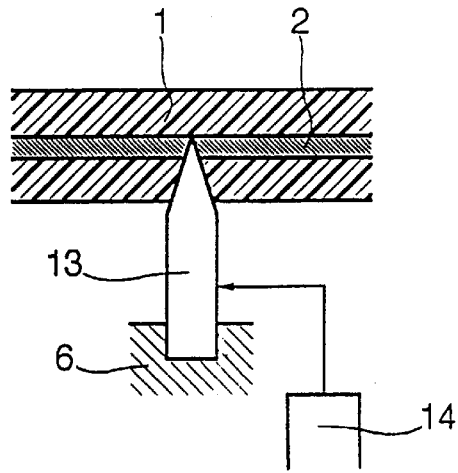
FIG. 5 is a block diagram showing a machining apparatus according to another embodiment of the present invention.

According to another embodiment of the present invention shown in FIG. 5, the electromagnetic wave generator 12 is not placed below the card. Instead, the machining apparatus 5 includes a point 13 supported by the table 6 that is placed so as to penetrate the card 1 on the table to a level at which contact is made with the winding 2 of the card (e.g., at a location away from the pads by penetrating the thickness of the winding). The point 13 is connected to an electric potential source 14 to generate an electric potential in the winding 2. Thus, the machining apparatus 5 having the point 13 can automatically form a cavity in the same manner as is described above for the machining apparatus having the electromagnetic wave generator.

Accordingly, the machining apparatus and machining method of embodiments of the present invention advantageously provide a reference position for the milling tool with respect to the conducting winding in the smart card. For each card machined, the reference position can be detected regardless of variations in thickness between various cards and variations in the position of the winding with respect to the faces of the various cards. Further, the control circuit automatically directs the entire milling operation. Thus, as long as the pads of the winding are suitably placed with respect to the faces of the smart card, the number of cards having to be rejected after cavity formation because of incorrect machining is significantly reduced without the need for increased machining time or operator supervision.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, embodiments of the present invention may not include all of the features described above Therefore, it is intended that the present invention not be limited to the particular embodiments disclosed, but that the invention include all embodiments falling within the scope of the appended claims.

What is claimed is:

1. A machining apparatus for machining a cavity in a smart card, said machining apparatus comprising:
   a card holder for holding the card;
   a milling tool;
   a drive mechanism connected to the milling tool, the drive mechanism rotating and feeding the milling tool;
   a control circuit couple to the drive mechanism, the control circuit controlling the drive mechanism;
   an electromagnetic field generator located in the environment of where the card is held by the card holder; and
   a detector coupled to the control circuit, the detector detecting a variation in an electric potential of the milling tool and delivering a reference signal to the control circuit when the variation exceeds a predetermined value,
   wherein the control circuit controls the drive mechanism such that when the reference signal is received from the detector to indicated a reference position, the milling tool is made to continue to penetrate the card for a predetermined travel from the reference position so as to reach a machining position, and
   the control circuit has an input that receives a second predetermined value corresponding to the predetermined travel from the reference position.

2. A method for machining a cavity in a smart card of the type containing at least one conducting winding, the end parts of the winding forming electrical connection pads, said method comprising the steps of:
   generating an electric potential in the winding;
   making a milling tool orthogonally penetrate the card in a region of at least one of the pads;

monitoring the electric potential of the milling tool to detect a variation in the potential of the milling tool that indicates a reference position of the milling tool with respect to the card and the pad;

continuing penetration of the milling tool for a predetermined travel from the reference position so as to reach a machining position; and supplying a predetermined value to a control circuit, the predetermined value corresponding to the predetermined travel from the reference position.

3. The method as defined in claim 2, further comprising the step of:

after reaching the machining position, moving the milling tool parallel to the card at the depth of the machining position in order to form the cavity in the card.

4. A method for machining a cavity in a smart card of the type containing at least one conducting winding, the end parts of the winding forming electrical connecting pads, said methods comprising the steps of:

generating an electric potential in the winding;

making a milling tool orthogonally penetrate the card in a region of at least one of the pads;

monitoring the electric potential of milling tool to detect a variation in the potential of the milling tool that indicates a reference position of the milling tool with respect to the card and the pad;

continuing penetration of the milling tool for predetermined travel from the reference position so as to reach a machining position; and after reaching the machining position, laterally moving the card with respect to the milling tool with the milling tool being at the depth of the machining position in order to form the cavity in the card.

5. The machining apparatus as defined in claim 1, wherein after reaching the machining position, the card is laterally moved with respect to the milling tool with the milling tool being at the depth of the machining position in order to form the cavity in the card.

6. The method as defined in claim 2, wherein in the generating step, an electromagnetic field is generated in the environment of the card in order to generate the electric potential in the winding.

7. A method for machining a cavity in a smart card of the type containing at least one conducting winding, the end part of the winding forming electrical connection pads, said method comprising the step of:

generating an electrical potential in the winding;

making a milling tool orthogonally penetrate the card in a region of at least one of the pads; and monitoring the electric potential of the milling tool to detect a variation in the potential of the milling tool that indicates a reference position of the milling tool with respect to the card and the pad, wherein the generating step includes the sub-steps of:
inserting a point into the card at least to a level at which contract is made with the winding; and
coupling the point to an electric potential source in order to generate the electric potential in the winding.

8. The method as defined in claim 2, further comprising the step of stopping penetration of the milling tool when the reference position is reached.

9. The method as defined in claim 2, further comprising the step of:

depositing a conduction material on one face of a first plastic sheet so as to form the winding; and adhesively bonding a second plastic sheet to the one face of the first plastic sheet.

10. The method as defined in claim 2, further comprising the step of:

after machining the cavity in the smart card, bonding an electronic chip in the cavity such that the pads of the winding electrically contact corresponding connection pads on the electronic chip.

11. A machining apparatus for machining a cavity in a smart card, said machining apparatus comprising:

a card holder for holding the card;

a milling tool;

a drive mechanism connected to the milling tool, the drive mechanism rotating and feeding the milling tool;

a control circuit coupled to the drive mechanism, the control circuit controlling the drive mechanism;

a point for insertion into the card at least to a level at which contact is made with a conducting winding contained in the card, the point having an interface for receiving an electric potential; and a detector coupled to the control circuit, the detector detecting a variation in the electric potential of the milling tool and delivering a reference signal to the control circuit when the variation exceeds a predetermined value.

12. The machining apparatus as defined in claim 11, wherein the point couples the electric potential to the winding in the card, and the control circuit controls the drive mechanism such that:
the milling tool is made to orthogonally penetrate the card in a region of at least one electrical connection pad that is formed by an end portion of the winding; and
when the reference signal received from the detector to indicate a reference position, the milling tool is made to continue to penetrate the card for a predetermined travel from the reference position so as to reach a machining position.

13. A machining apparatus for machining a cavity in a smart card, said machining apparatus comprising:

a card holder for holding the card;

a milling tool;

a drive mechanism connected to the milling tool, the drive mechanism rotating and feeding the milling tool;

a control circuit couple to the drive mechanism, the control circuit controlling the drive mechanism;

an electromagnetic field generator located in the environment of where the card is held by the card holder; and a detector coupled to the control circuit, the detector detecting a variation in an electric potential of the milling tool and delivering a reference signal to the control circuit when the variation exceeds a predetermined value, wherein the electromagnetic field generator generates an electric potential in a conducting winding contained in the card, the control circuit controls the drive mechanism such that:
the milling tool is made to orthogonally penetrate the card in a region of at least one electrical connection pad that is formed by an end portion of the winding; and
when the reference signal is received from the detector to indicate a reference position, the milling tool is made to continue to penetrate the card for a predetermined travel from the reference position so as to reach a machining position, and the control circuit has an input that receives a second predetermined value corresponding to the predetermined travel from the reference position.

14. The machining apparatus as defined in claim 13, wherein the control circuit further control the drive mechanism such that after the milling tool reaches the machining position, the milling tool is made to move parallel to the card at a depth of the machining position in order to form the cavity in the card.

15. The machining apparatus as defined in claim 10, wherein the control circuit further control the drive mechanism such that after the milling tool reaches the machining position, the milling tool is made to move parallel to the card at a depth of the machining position in order to form the cavity in the card.

16. The machining apparatus as defined in claim 12, wherein the control circuit has an input that receives a second predetermined value corresponding to the predetermined travel from the reference position.

* * * * *